United States Patent [19]

Levonius, Jr.

[11] Patent Number: 4,700,128

[45] Date of Patent: Oct. 13, 1987

[54] ELECTRONIC CALIBRATOR

[76] Inventor: Carl G. Levonius, Jr., 512 Bethany Curve, Santa Cruz, Calif. 95060

[21] Appl. No.: 206,640

[22] Filed: Nov. 13, 1980

[51] Int. Cl.[4] .......................................... G01R 35/00
[52] U.S. Cl. ........................................ 324/74; 73/1 R
[58] Field of Search ................... 324/74, 130, 121 R; 73/1 R; 310/10 R; 15/250.16, 250.17

[56] References Cited

U.S. PATENT DOCUMENTS

| 2,221,115 | 11/1940 | Shepard, Jr. | 324/121 R |
| 2,987,747 | 6/1961 | Oishei et al. | 15/250.16 |
| 3,181,063 | 4/1965 | Ullrich | 324/74 |
| 3,439,258 | 4/1969 | VanLeeuwen | 323/75 |
| 3,454,880 | 7/1969 | Ries et al. | 324/130 |
| 3,535,637 | 10/1970 | Goransson | 324/130 |
| 4,041,382 | 8/1977 | Washburn | 324/65 R |

OTHER PUBLICATIONS

Pawson, I.; "Scope Trace . . . "; Television; Jul. 1978; pp. 468–469.

Primary Examiner—Ernest F. Karlsen

[57] ABSTRACT

An electronic calibrator having a CMOS integrated circuit transmission gate which responds to the output of a multi-vibrator. The output from the transmission gate is buffered and amplified to derive either a constant voltage or a constant current signal for delivery to a signal path.

1 Claim, 5 Drawing Figures

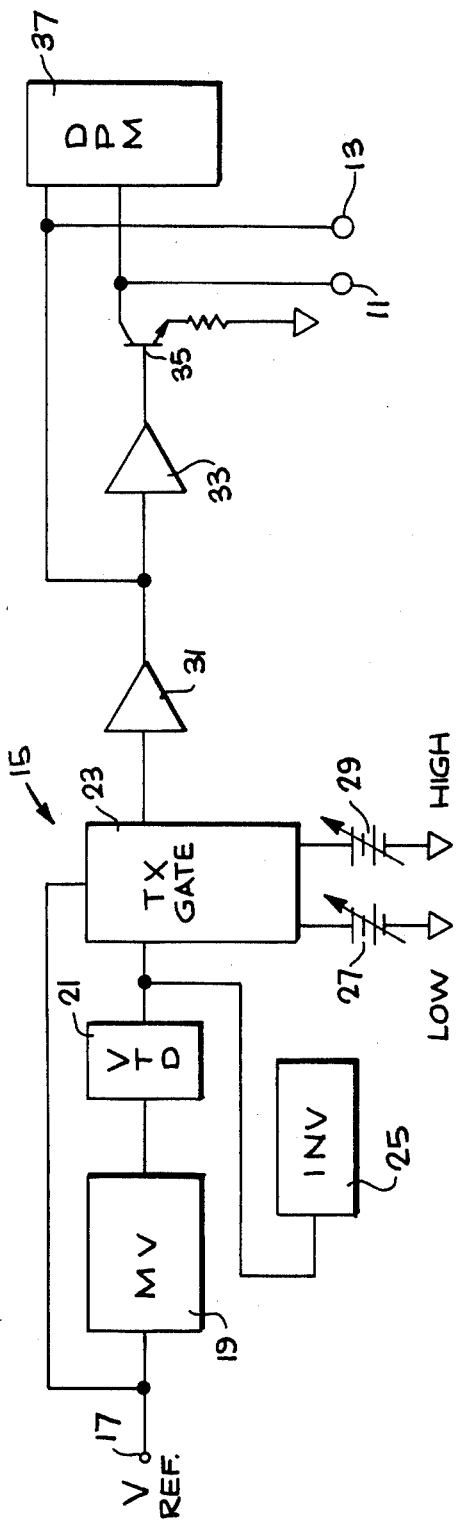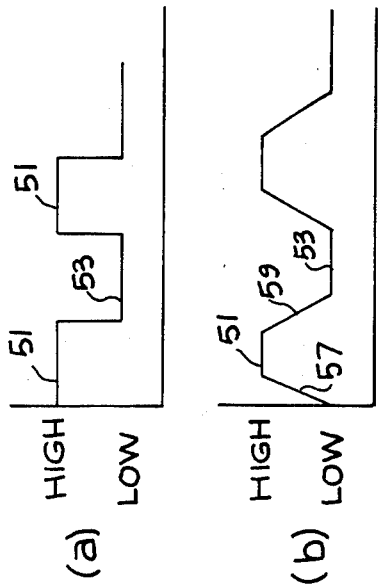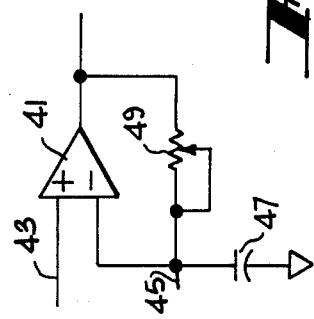
Fig. 1a
Fig. 1b
Fig. 2

1

ELECTRONIC CALIBRATOR

TECHNICAL FIELD

The invention relates to calibrating apparatus and more particularly to an apparatus for calibrating a transducer, at multiple signal levels, relative to recording or control apparatus.

Oftentimes recording and control devices, such as computers, are located remote from a transducer. For example, a transducer may measure the flow rate of a river or the temperature atop a building. Typically, the transducer converts the measured quantity to a signal, which may be either a specified voltage or current level and transmits the signal to a recorder or control device over a pair of wires or similar communications channel. Sometimes the transmission path may be quite long and consequently the signal path is sometimes lossy. Prior to making a measurement, the transducer is disconnected and a reference signal is applied to the signal path. Since it is desirable to check both the low and high signal levels of the transducer, in the dynamic range sense and not the power level sense, a low signal level is first applied to the transducer and then a high signal level is applied. The signal levels simulate the dynamic range of the transducer in terms of the span of the signals to be produced.

BACKGROUND ART

A typical calibrator of the prior art is shown in U.S. Pat. No. 4,163,938 to Moore. This patent shows a calibrator capable of generating multiple voltages or signal levels for simulating a transducer.

One of the problems experienced with prior art calibrators is associated with the remote location of a transducer relative to a recording or control device. For example, where a transducer is located near a river, an operator must first remove the transducer and attach a calibrator and then travel from the river to the site of the recording or control device, often a long distance. Once the calibrator is checked at one reference level, it is usually checked at another level characteristic of a different point in the dynamic range of the instrument. To set another level in the calibrator a trip is required back to the river to adjust the calibrator for the other signal level. The trips back and forth between the transducer and the recording or control device are time consuming in the situation where a single person is attempting calibration.

An object of the invention was to devise a calibrator which would permit a single person to calibrate a transducer or the like automatically, at multiple signal levels.

DISCLOSURE OF INVENTION

In accord with the present invention, a calibrator is provided which has circuits for generating at least two output signal levels which duplicate known electrical characteristics, namely signal levels at different dynamic range conditions, of a measurement transducer. The principal novel feature associated with the present invention is an electronic switch within the calibrator for sequentially switching between the two signal levels and maintaining at least one of the levels for a preset time, preferably exceeding one second or a few seconds.

With this apparatus, the calibrator may be connected to a signal path so that a person located near a recorder or a control device can observe the signal as it automatically switches between preset signals levels. As the calibrator simulates transducer signal levels, the recording or control device may be adjusted to indicate or offset losses in the signal path, or elsewhere.

BRIEF DESCRIPTION OF DRAWINGS

FIG. 1a is simplified schematic of the calibrator of the present invention.

FIG. 1b is a detail of a ramping circuit which may optionally be connected within the calibrator illustrated in FIG. 1a.

FIG. 2 shows alternate plots of two signal levels generated by the transducer with sequential alternation between high and low signal levels.

BEST MODE FOR CARRYING OUT THE INVENTION

Figure 3A:
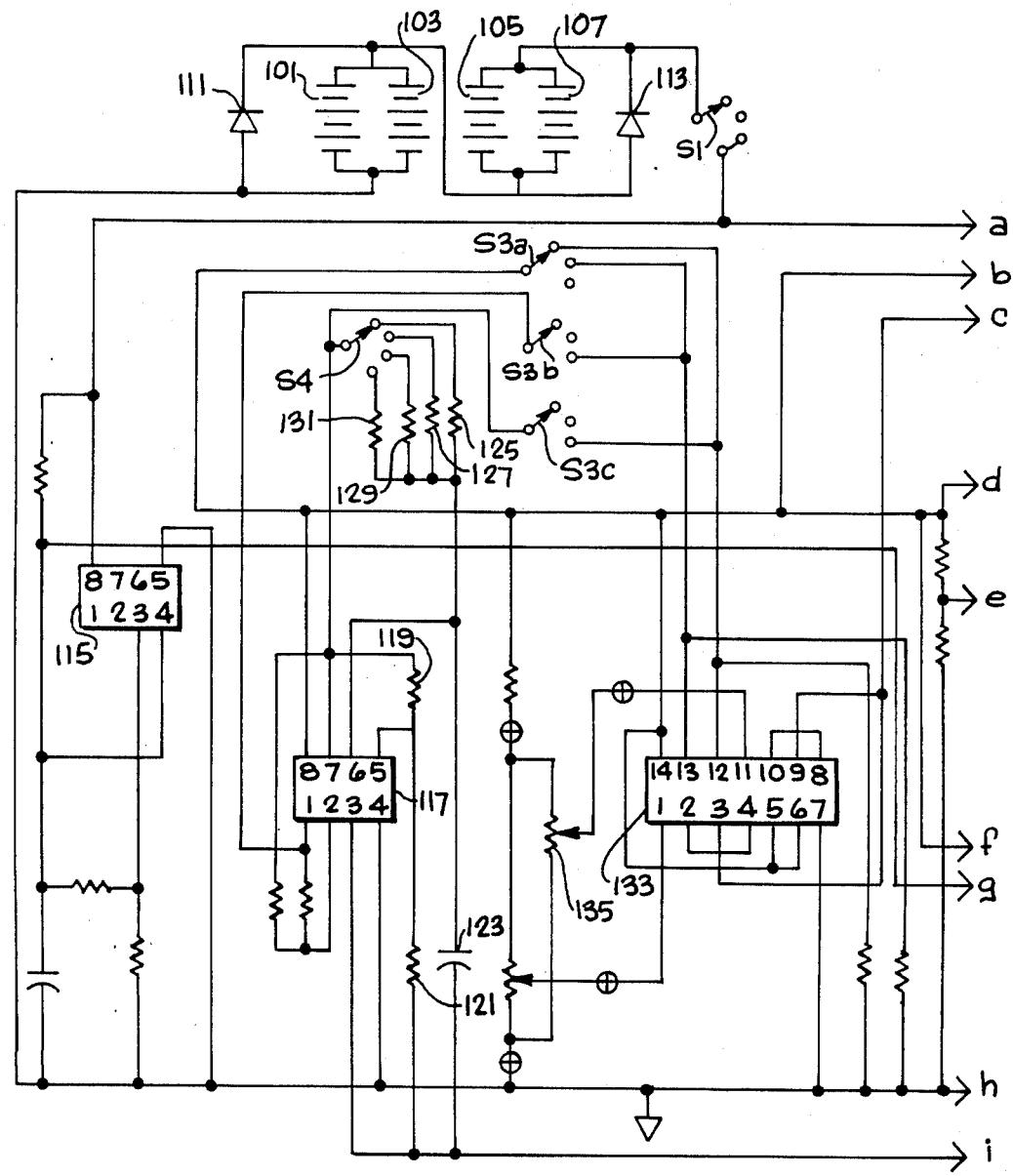
FIGS. 3a and 3b constitute a single detailed schematic for the calibrator of the present invention, including the optional ramping circuit of FIG. 1b.

Referring to FIG. 1a, electrical output terminals 11 and 13 are shown which deliver the output signal levels of the calibrator 15 of the present invention to a transmission path, not shown. The calibrator receives an input voltage, $V_{REF}$, at terminal 17 which drives a multivibrator 19 at a uniform rate. The period of multivibrator 19 may be adjusted by the variable time delay 21 so that an output wave will have a half period of at least a second and preferably longer. The output from variable time delay 21 is applied to a transmission gate 23 both directly and through an inverter 25. The transmission gate 23 has two channels, with one channel being switched off as the other is switched on. The direct connection from variable time delay 21 constitutes one switching signal, while the indirect path through inverter 25 constitutes an inverse switching signal for the opposite channel. One channel is associated with a low signal level which is preset from the variable source 27, such as a low signal level. Another variable source 29 is preset at another signal level at or near the opposite end of the dynamic range of a transducer to be calibrated, such as a high signal level. For example, if the output of a flow meter produces a voltage level of between one volt d.c. and plus five volts d.c., the first variable source 27 would be set to one volt, while the second variable source 29 would be set to five volts.

The periodic signal from transmission gate 23 is transmitted through a voltage amplifier 31 to a signal amplifier 33 and an output driver 35, which is shown to be a transistor. Output driver 35 may produce a constant current at output terminal 11. Alternatively, the output may be taken as a voltage which is available at terminal 13. Either the voltage level or the current level may be read by a digital panel meter 37 which forms a portion of the calibrator of the present invention.

With reference to FIG. 1b, the amplifier 31 of FIG. 1a may be fed by amplifier 41 of FIG. 1b. Such an amplifier receives the output of transmission gate 23 along line 43 and produces an output along line 45 which is transmitted to the signal amplifier 31 in FIG. 1a. Amplifier 41 has a feedback loop including a capacitor 47 and a variable resistor 49. The feedback loop produces a ramping between the high and low signal levels transmitted through the transmission gate. This may be seen with reference to FIG. 2.

With reference to FIG. 2, the output of the calibrator of the present invention may be seen. In plot (a), without ramping, such an output varies between a high level signal 51 and a low level 53. The duration at the high level is at least a second and preferably longer. The duration at the low level is typically the same as at the high level. It may be seen that after reaching the low level, the calibrator automatically returns to high level 51. Switching is accomplished by the transmission gate 23 in FIG. 1a which is a CMOS switch.

With reference to plot (b) of FIG. 2, the same high and low levels exist, but they are attained with ramping, achieved with a circuit such as the one shown in FIG. 1b. For example, to reach level 51, the ascending ramp 57 is produced, which lasts approximately 25 to 50 percent of the half period of a single oscillation. As soon as the half period is complete, the descending ramp 59 is generated, taking the high level gradually to low level 53. In this application, the time for a high or low level half period includes the time occupied by a ramp signal.

Figure 3B:
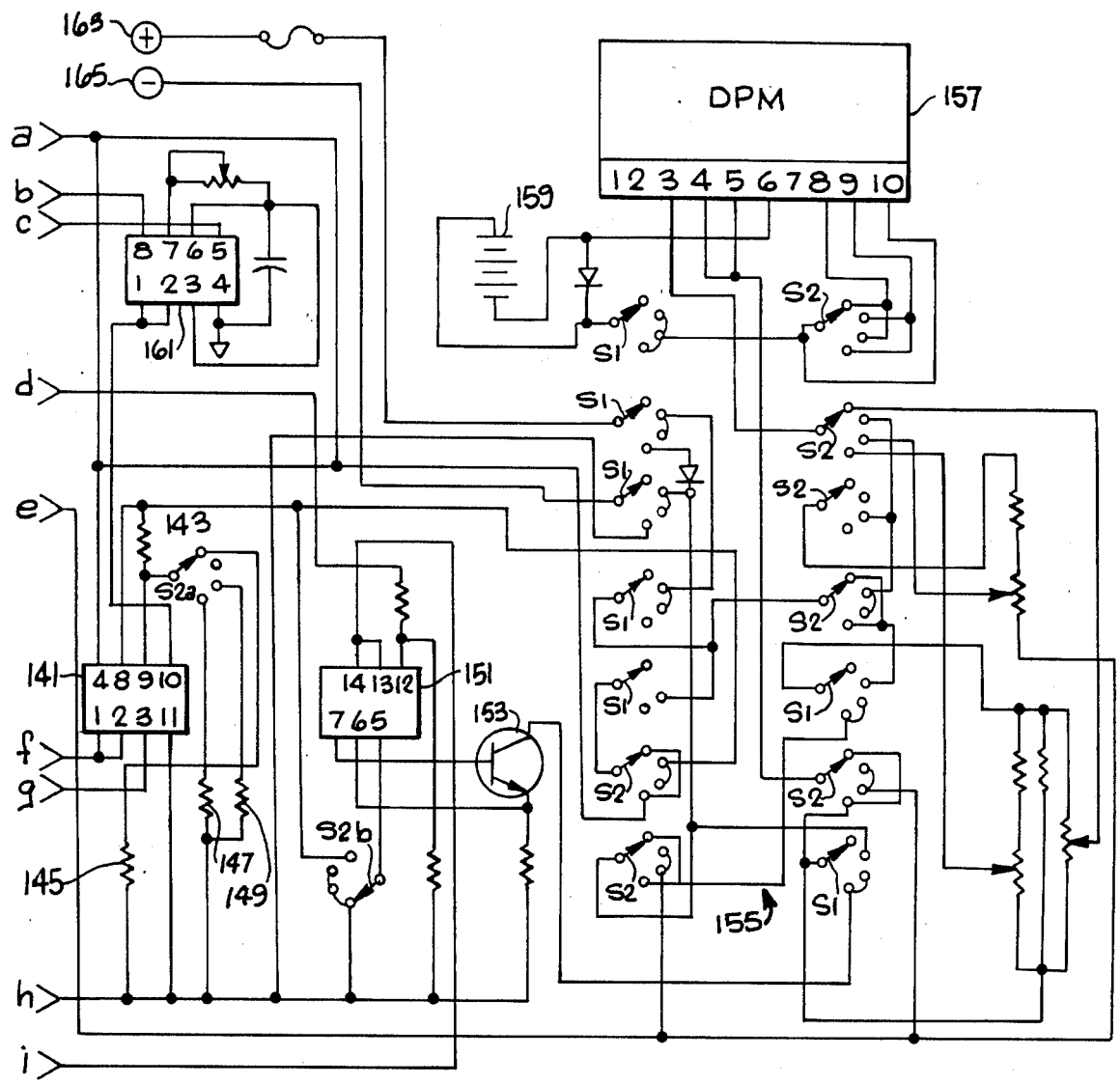

The calibrator of the present invention may be understood more clearly with reference to the detail schematic of FIGS. 3a and 3b, which should be joined along lines a-a, b-b, c-c, d-d, e-e, f-f, g-g, h-h and i-i to form a single schematic. Power is supplied by nine-volt batteries 101, 103, 105 and 107. Batteries 101 and 103 are connected in parallel, as are batteries 105 and 107. The parallel pairs of batteries are connected in series to achieve an eighteen-volt supply. Diodes 111 and 113 protect circuits from a reverse battery condition. A switch S1, is used for output mode selection, as described below. A voltage regulator 115 receives power from the batteries and produces a regulated nine-volt supply. Regulator 115 is an integrated circuit, known as ICL8212. The output is transmitted to the quad operational amplifier 141 in FIG. 3b and specifically to terminals 1, 2 and 3 which form the voltage amplifier. This operational amplifier is an integrated circuit known as LM324. Note that regulated power is supplied to several circuits from this source. Power from regulated supply 115 is halved to a regulated 4.5 volt supply and used to feed an astable multivibrator 117 which is formed by one half of the dual operational amplifier integrated circuit, LM358, which is represented by the block. Specifically, terminals 5, 6 and 7 are connected to resistors 119 and 121, as well as capacitor 123 for completing the formation of the astable multivibrator. Terminals 1, 2, 3 are associated with another operational amplifier which is used as an inverting amplifier, namely the inverting amplifier 25 of FIG. 1a. A network of resistors 125, 127, 129 and 131 are used to vary the period of the multivibrator, such that the half period is preferably longer than one second. Typical preferred values for the multivibrator half period may be seven seconds, fifteen seconds, thirty seconds and sixty seconds. Alternatively, a potentiometer could be used in lieu of resistors 125, 127, 129 and 131. Resistor values which are scaled proportionately are used, such as fifty, one hundred, two hundred and four hundred kilo ohms. The multivibrator output is transmitted to the transmission gate 133 which is a CMOS switch integrated circuit, known as CD4016. The variable supplies 27 and 29 of FIG. 1a are in fact potentiometers 135 and 137 which set the high level and low level signals respectively for the transmission gate 133.

The other amplifier of the quad operational amplifier 141 in combination with resistor 143 and resistors, 145, 147 and 149 form a voltage amplifier, corresponding to amplifier 31 of FIG. 1a. The switch S2a allows selection of this function while switch S2b allows selection of a current amplifier 151 which is the second half of the quad operational amplifier. An output driver transistor 153 receives the current signal and produces a desired level of current flow. A switch network 155 couples the voltage or current outputs to selected pins of a digital panel meter 157 which is energized by a power source 159. Switch network 155, as well as switches S1a and S1b permit generation of the following signal levels: 0–199.9 mv.; 0–11 v.; 0–19.99 ma.; 0–55.0 ma.

The ramp generator illustrated in FIG. 1b is the integrated circuit 161, an LM358 amplifier connected with feedback between the transmission gate 133 and the voltage amplifier in integrated circuit 141. Outputs are taken at terminals 161 and 163, corresponding to terminals 11 and 13 of FIG. 1a.

All switches labeled S1 are ganged together on a single shaft. Similarly, all switches labeled S2 are ganged together, including S2a and S2b. Switches labeled S3a, S3b and S3c are ganged together. Switch S1 has four positions in clockwise order as follows: off, signal in, signal out and a transmitter for a two wire loop. In the signal in position the meter 157 is used to measure current or voltage in the signal loop. In the signal out position, the calibrator simulates a transducer, with the exception that loop power is generated by the calibrator. In the transmitter position, the calibrator simulates a transducer in the usual sense, i.e., line power is received from the receiver, which may be the recording or control device.

The switch S2 is a function switch having four positions in a clockwise direction as follows: 0–19.99 ma. The second position is 0–199.9 mv. The third position is 0–11 v. The fourth position is 0–55 ma. In these positions, the meter 157 may measure signal levels in or out of the calibrator.

The switch S3 has three positions, two of which are manual mode positions such that the calibrator can be operated in a manner similar to prior art devices. Proceeding in a clockwise direction, these two positions are signal high and signal low. The third position is an automatic switching position wherein automatic switching between high and low signal levels occurs as discussed previously and shown in FIG. 2.

The switch S4 controls the variable time delay and has four positions. Proceeding in a clockwise direction, typical time delays are 7, 15, 30 and 60 seconds.

While the present invention has been explained with d.c. reference levels for simulating the dynamic range of a transducer, a.c. reference levels could also be used. The output of the calibrator can also simulate pneumatic transducers by adding an I/P converter (current to pneumatic) for calibrating pneumatic process control loops.

We claim:

1. An electronic calibrator for establishing multiple signal levels comprising,
    means for generating at least two variable levels of a reference signal representing signal levels generated by a measurement transducer of the type having an electrical output with known electrical characteristic,
    an electronic switch means for sequentially switching between said two variable reference signal levels and combining said two levels into a single output signal oscillating between the two levels, said switch means including a timing circuit for maintaining at least one of said two signal levels for a preset time exceeding one second, and means connected to said electronic switch means for transmitting along an output cable output signal levels corresponding to said reference signal levels, said output signal levels duplicating the known electrical dynamic range of said measurement transducer, wherein said means for generating output signal levels corresponding to said reference signal levels comprises a constant current supply, a constant voltage supply and a second manual switch means for selecting either of said constant current and voltage supplies.

* * * * *